(12) United States Patent
Shen et al.

(10) Patent No.: US 9,324,626 B2
(45) Date of Patent: Apr. 26, 2016

(54) INTERPOSERS WITH CIRCUIT MODULES ENCAPSULATED BY MOLDABLE MATERIAL IN A CAVITY, AND METHODS OF FABRICATION

(71) Applicant: Invensas Corporation, San Jose, CA (US)

(72) Inventors: Hong Shen, Palo Alto, CA (US); Liang Wang, Milpitas, CA (US); Rajesh Katkar, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/558,462

(22) Filed: Dec. 2, 2014

(65) Prior Publication Data
US 2015/0262928 A1      Sep. 17, 2015

Related U.S. Application Data

(60) Provisional application No. 61/952,066, filed on Mar. 12, 2014.

(51) Int. Cl.
*H01L 23/31* (2006.01)
*H01L 21/288* (2006.01)
(Continued)

(52) U.S. Cl.
CPC .......... *H01L 23/315* (2013.01); *H01L 21/2885* (2013.01); *H01L 21/56* (2013.01); *H01L 21/76879* (2013.01); *H01L 21/76897* (2013.01); *H01L 23/04* (2013.01); *H01L 23/147* (2013.01); *H01L 23/3107* (2013.01); *H01L 23/3675* (2013.01); *H01L 23/49827* (2013.01);
(Continued)

(58) Field of Classification Search
CPC ................................................ H01L 23/49838

USPC .......................................................... 257/686
See application file for complete search history.

(56) References Cited

U.S. PATENT DOCUMENTS

| 5,532,519 A | 7/1996 | Bertin et al. |
| 5,701,233 A | 12/1997 | Carson et al. |

(Continued)

FOREIGN PATENT DOCUMENTS

| EP | 1 418 617 A2 | 5/2004 |
| EP | 1 884 994 A2 | 2/2008 |

(Continued)

OTHER PUBLICATIONS

Notice of Allowance dated Apr. 16, 2015 of U.S. Appl. No. 14/268,899.

(Continued)

*Primary Examiner* — Marc Armand
(74) *Attorney, Agent, or Firm* — Haynes and Boone, LLP

(57) ABSTRACT

Stacked dies (110) are encapsulated in an interposer's cavity (304) by multiple encapsulant layers (524) formed of moldable material. Conductive paths (520, 623) connect the dies to the cavity's bottom all (304B) and, through TSVs passing through the bottom wall, to a conductor below the interposer. The conductive paths can be formed in segments each of which is formed in a through-hole (514) in a respective encapsulant layer. Each segment can be formed by electroplating onto a lower segment; the electroplating current can be provided from below the interposer through the TSVs and earlier formed segments. Other features are also provided.

30 Claims, 11 Drawing Sheets

(51) Int. Cl.
  *H01L 21/56* (2006.01)
  *H01L 21/768* (2006.01)
  *H01L 23/04* (2006.01)
  *H01L 23/14* (2006.01)
  *H01L 23/367* (2006.01)
  *H01L 23/498* (2006.01)
  *H01L 23/00* (2006.01)
  *H01L 25/065* (2006.01)
  *H01L 25/00* (2006.01)
  *H01L 23/10* (2006.01)

(52) U.S. Cl.
  CPC ............ *H01L24/97* (2013.01); *H01L 25/0652* (2013.01); *H01L 25/50* (2013.01); *H01L 23/10* (2013.01); *H01L 23/49838* (2013.01); *H01L 2224/16145* (2013.01); *H01L 2224/16225* (2013.01); *H01L 2224/32225* (2013.01); *H01L 2224/73204* (2013.01); *H01L 2924/15311* (2013.01); *H01L 2924/181* (2013.01)

(56) References Cited

U.S. PATENT DOCUMENTS

| | | | |
|---|---|---|---|
| 6,157,076 | A | 12/2000 | Azotea et al. |
| 6,222,722 | B1 | 4/2001 | Fukuzumi et al. |
| 6,251,796 | B1 | 6/2001 | Abdul-Ridha et al. |
| 6,322,903 | B1 | 11/2001 | Siniaguine et al. |
| 6,384,473 | B1 | 5/2002 | Peterson et al. |
| 6,403,444 | B2 | 6/2002 | Fukuzumi et al. |
| 6,451,650 | B1 | 9/2002 | Lou |
| 6,492,726 | B1 | 12/2002 | Quek et al. |
| 6,613,672 | B1 | 9/2003 | Wang et al. |
| 6,620,701 | B2 | 9/2003 | Ning |
| 6,624,505 | B2 | 9/2003 | Badehi |
| 6,717,254 | B2 | 4/2004 | Siniaguine |
| 6,746,876 | B2 | 6/2004 | Itoh et al. |
| 6,787,916 | B2 | 9/2004 | Halahan |
| 6,947,275 | B1 | 9/2005 | Anderson et al. |
| 6,958,285 | B2 | 10/2005 | Siniaguine |
| 7,011,988 | B2 | 3/2006 | Forcier |
| 7,049,170 | B2 | 5/2006 | Savastiouk et al. |
| 7,061,102 | B2 | 6/2006 | Eghan et al. |
| 7,115,988 | B1 | 10/2006 | Hool |
| 7,144,745 | B2 | 12/2006 | Badehi |
| 7,183,643 | B2 | 2/2007 | Gibson et al. |
| 7,400,036 | B2 | 7/2008 | Tan |
| 7,670,921 | B2 | 3/2010 | Chinthakindi et al. |
| 7,863,096 | B2 | 1/2011 | England |
| 7,906,803 | B2 | 3/2011 | Shioya et al. |
| 7,928,548 | B2 | 4/2011 | Bernstein et al. |
| 7,977,579 | B2 | 7/2011 | Bathan et al. |
| 7,989,270 | B2 | 8/2011 | Huang et al. |
| 8,018,068 | B1 | 9/2011 | Scanlan |
| 8,071,470 | B2 | 12/2011 | Khor et al. |
| 8,072,082 | B2 | 12/2011 | Yean et al. |
| 8,076,788 | B2 | 12/2011 | Haba et al. |
| 8,102,039 | B2 | 1/2012 | Noma et al. |
| 8,110,862 | B2 | 2/2012 | Cheng et al. |
| 8,183,696 | B2 | 5/2012 | Meyer |
| 8,257,985 | B2 | 9/2012 | Stevenson |
| 8,377,829 | B2 | 2/2013 | Yeh et al. |
| 8,378,480 | B2 | 2/2013 | Chen et al. |
| 8,397,013 | B1 | 3/2013 | Rosenband et al. |
| 8,426,961 | B2 | 4/2013 | Shih et al. |
| 8,470,668 | B2 | 6/2013 | Cho et al. |
| 8,518,753 | B2 | 8/2013 | Wu et al. |
| 8,519,537 | B2 | 8/2013 | Jeng et al. |
| 8,525,318 | B1 | 9/2013 | Kim |
| 8,575,493 | B1 | 11/2013 | Xu et al. |
| 8,598,695 | B2 | 12/2013 | Oganesian et al. |
| 8,629,546 | B1 | 1/2014 | Scanlan |
| 8,674,423 | B2 | 3/2014 | Collins et al. |
| 9,165,793 | B1 | 10/2015 | Wang |
| 2004/0174682 | A1 | 9/2004 | Lin |
| 2004/0178495 | A1 | 9/2004 | Yean |
| 2004/0183187 | A1 | 9/2004 | Yamasaki et al. |
| 2004/0201111 | A1 | 10/2004 | Thurgood |
| 2005/0046002 | A1 | 3/2005 | Lee |
| 2005/0047094 | A1 | 3/2005 | Hsu et al. |
| 2005/0196095 | A1 | 9/2005 | Karashima et al. |
| 2005/0263869 | A1 | 12/2005 | Tanaka et al. |
| 2005/0266701 | A1 | 12/2005 | Aoyagi |
| 2007/0029654 | A1 | 2/2007 | Sunohara et al. |
| 2007/0045798 | A1 | 3/2007 | Horie et al. |
| 2007/0235850 | A1 | 10/2007 | Gerber et al. |
| 2008/0128897 | A1 | 6/2008 | Chao |
| 2008/0244902 | A1* | 10/2008 | Blackwell et al. ............. 29/844 |
| 2008/0280394 | A1 | 11/2008 | Murtuza |
| 2009/0008762 | A1 | 1/2009 | Jung |
| 2009/0115047 | A1 | 5/2009 | Haba et al. |
| 2009/0267238 | A1 | 10/2009 | Joseph et al. |
| 2010/0025081 | A1 | 2/2010 | Arai et al. |
| 2010/0084761 | A1 | 4/2010 | Shinagawa |
| 2010/0134991 | A1 | 6/2010 | Kim |
| 2010/0144101 | A1 | 6/2010 | Chow |
| 2010/0224980 | A1 | 9/2010 | Chahal et al. |
| 2010/0230797 | A1 | 9/2010 | Honda |
| 2010/0230806 | A1 | 9/2010 | Huang et al. |
| 2010/0276799 | A1 | 11/2010 | Heng et al. |
| 2011/0027967 | A1 | 2/2011 | Beyne et al. |
| 2011/0068468 | A1 | 3/2011 | Lin |
| 2011/0101349 | A1 | 5/2011 | Oda |
| 2011/0221072 | A1 | 9/2011 | Chin |
| 2011/0287606 | A1 | 11/2011 | Brun et al. |
| 2012/0061852 | A1 | 3/2012 | Su et al. |
| 2012/0086135 | A1 | 4/2012 | Thompson et al. |
| 2012/0091583 | A1 | 4/2012 | Kawashita et al. |
| 2012/0101540 | A1 | 4/2012 | O'Brien et al. |
| 2012/0106228 | A1 | 5/2012 | Lee |
| 2012/0228778 | A1 | 9/2012 | Kosenko et al. |
| 2012/0276733 | A1 | 11/2012 | Saeki et al. |
| 2012/0295415 | A1 | 11/2012 | Ono |
| 2012/0319300 | A1* | 12/2012 | Kim et al. ..................... 257/777 |
| 2013/0010441 | A1 | 1/2013 | Oganesian et al. |
| 2013/0014978 | A1 | 1/2013 | Uzoh et al. |
| 2013/0082383 | A1 | 4/2013 | Aoya |
| 2013/0082399 | A1 | 4/2013 | Kim et al. |
| 2013/0087917 | A1 | 4/2013 | Jee et al. |
| 2013/0093075 | A1 | 4/2013 | Liu et al. |
| 2013/0099368 | A1 | 4/2013 | Han |
| 2013/0119527 | A1 | 5/2013 | Luo et al. |
| 2013/0119528 | A1 | 5/2013 | Groothuis et al. |
| 2013/0146991 | A1 | 6/2013 | Otremba et al. |
| 2013/0181354 | A1 | 7/2013 | Khan et al. |
| 2013/0228898 | A1 | 9/2013 | Ide |
| 2013/0241026 | A1 | 9/2013 | Or-Bach et al. |
| 2013/0267046 | A1 | 10/2013 | Or-Bach et al. |
| 2013/0270660 | A1 | 10/2013 | Bryzek et al. |
| 2013/0292840 | A1 | 11/2013 | Shoemaker et al. |
| 2013/0313680 | A1 | 11/2013 | Oganesian et al. |
| 2014/0036454 | A1 | 2/2014 | Caskey et al. |
| 2014/0070380 | A1 | 3/2014 | Chiu et al. |
| 2015/0262902 | A1 | 9/2015 | Shen |
| 2015/0262972 | A1 | 9/2015 | Katkar |

FOREIGN PATENT DOCUMENTS

| | | |
|---|---|---|
| EP | 1688994 B1 | 8/2008 |
| EP | 2546876 A1 | 1/2013 |
| EP | 2 555 239 A2 | 2/2013 |
| WO | WO 2005/022630 A1 | 3/2005 |
| WO | WO 2006/124597 A2 | 11/2006 |
| WO | WO 2007/142721 A1 | 12/2007 |
| WO | WO 2009/070348 A1 | 6/2009 |
| WO | WO 2012/169162 A1 | 12/2012 |
| WO | WO 2013/062533 A1 | 5/2013 |

OTHER PUBLICATIONS

Final Office Action dated Mar. 2, 2015 of U.S. Appl. No. 14/214,365.
U.S. Appl. No. 14/201,585, filed Mar. 7, 2014.
U.S. Appl. No. 14/214,365, filed Mar. 14, 2014.

(56) References Cited

OTHER PUBLICATIONS

Hybrid Memory Cube Consortium, "Hybrid Memory Cube Specification 1.0," Last Revision Jan. 2013, 122 pages, Retrieved from: http://hybridmemorycube.org/specification-download/.
ChipScale Review, "The Impact of CSPs on Encapsulation Materials," ChipScale Review publication issue Mar. 1998, retrieved Feb. 21, 2014, 6 pages.
Dr. Paul A. Magill, "A New Thermal-Management Paradigm for Power Devices," Power Electronics Technology, Nov. 2008, pp. 26-30.
Herming Chiueh et al., "A Dynamic Thermal Management Circuit for System-On-Chip Designs," Analog Integrated Circuits and Signal Processing, 36, pp. 175-181, Jan. 25, 2003.
K. Zoschke et al., "Hermetic Wafer Level Packaging of MEMS Components Using Through Silicon Via and Wafer to Wafer Bonding Technologies" (2013 Electronic Components & Technology Conference, IEEE, pp. 1500-1507).
Lau et al., "Thin-Wafer Handling with a Heat-Spreader Wafer for 2.5D/3D IC Integration," 46$^{th}$ International Symposium on Microelectronics (IMAPS 2013) Sep. 30-Oct. 3, 2013, Orlando, FL USA, pp. 1-8 [389-396].
Li Shang et al., "Thermal Crisis: Challenges and Potential Solutions," Potentials, vol. 25, Issue 5, Sep./Oct. 2006, pp. 31-35.
Nakamura et al., "Technology Trends and Future History of Semiconductor Packaging Substrate Material," Hitachi Chemical Review Technical Report No. 55, May 2013, pp. 24-29.
Pulliam, Wayne, "Designing with BGAs," AMD presentation, 2008, 62 pages.
San Hwui Lee et al., "Wafer-to-Wafer Alignment for Three Dimensional Integration: A Review," Journal of Microelectromechanical Systems, vol. 20, Issue 4, Aug. 2011, pp. 885-898.
Dreiza; Moody et al., "Joint Project for Mechanical Qualification of Next Generation High Density Package-on-Package (PoP) with Through Mold Via Technology," Amkor Technology, EMPC2009—17th European Microelectronics & Packaging Conference, Jun. 16, Rimini, Italy, 8 pages.
Zwenger; Curtis et al., "Next Generation Package-on_Package (PoP) Platform with Through Mold Via (TMV™) Interconnection Technology," Amkor Technology, Originally published in the proceedings of the IMPAS Device Packaging Conference, Scottsdale, AZ, Mar. 10-12, 2009, 8 pages.
Kim; Jinseong et al., "Application of Through Mold Via (TMV) as PoP base package," Amkor Technology, 2008 IEEE Reprinted from ECTC2008 Proceedings, 6 pages.
U.S. Appl. No. 14/250,317 titled "Die Stacks With One or More Bond Via Arrays," filed Apr. 10, 2014, 58 pages.
Das; Rabindra N. et al., "Package-Interpose-Package (PIP) Technology for High End Electronics," Endicott Interconnect Technologies, Inc., retrieved Jul. 31, 2014, 4 pages.
McCormick; Heather et al., "Assembly and Reliability Assessment of Fine Pitch TMV Package on Package (PoP) Components, " Amkor Technology Inc., Originally published in the Proceedings of the SMTA International Conference, San Diego, CA, Oct. 4-8, 2009, 8 pages.
U.S. Appl. No. 14/288,064 titled, "Integrated Circuit Assemblies With Reinforcement Frames, and Methods of Manufacture," filed May 27, 2014.
U.S. Appl. No. 14/268,899 titled, "Making Electrical Components in Handle Wafers of Integrated Circuit Packages," filed May 2, 2014.
K.T. Turner et al., "Mechanics of direct wafer bonding", Proc. R. Soc. A, 462, 171-188, Nov. 9, 2005.
Pre-Interview First Office Action dated Oct. 22, 2014 of U.S. Appl. No. 14/214,365.
U.S. Appl. No. 14/328,380 titled, "Microelectronic Assemblies With Integrated Circuits and Interposers With Cavities, and Methods of Manufacture," filed Jul. 10, 2014.
A. Strandjord et al., "Bumping for WLCSP using Solder Ball Attach on electrolessss NiAu UBM", Pac Tech USA—Packaging Technologies, Inc., 29 pages, 2008.
M.A. Boyle et al., "Epoxy Resins", Composites, vol. 21, ASM Handbook, ASM International, p. 78-89, 2001.
International Search Report and Written Opinion, Aug. 6, 2015, 10 pages, PCT Patent Application No. PCT/US2015/028172.
International Search Report and Written Opinion for PCT/US2015/019609 dated May 12, 2015, 11 pages.
International Search Report and Written Opinion in PCT/US2015/063128, issued Feb. 18, 2016.

* cited by examiner

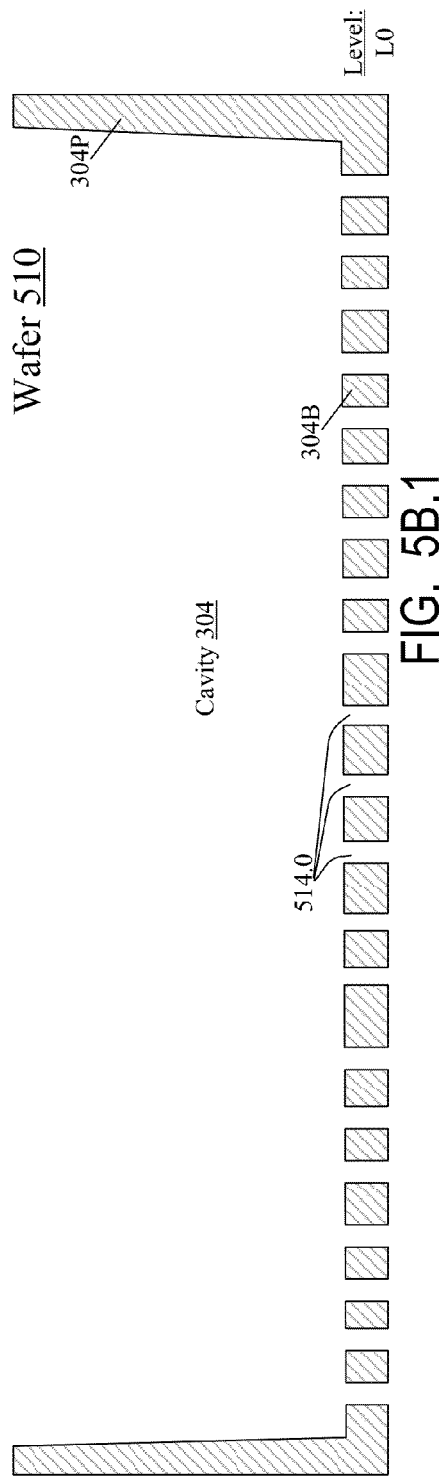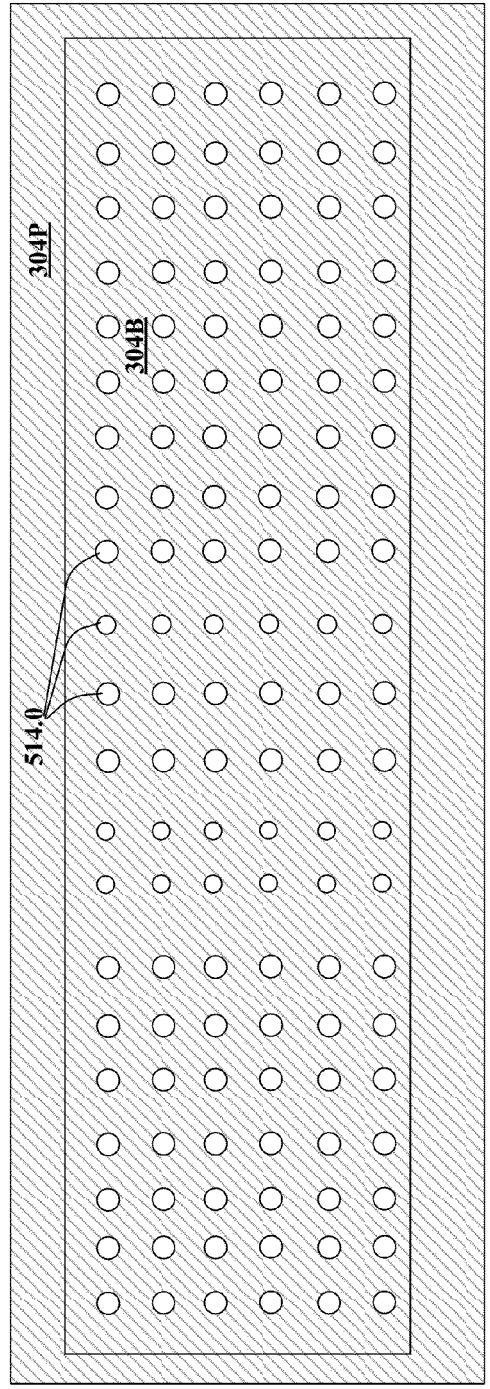

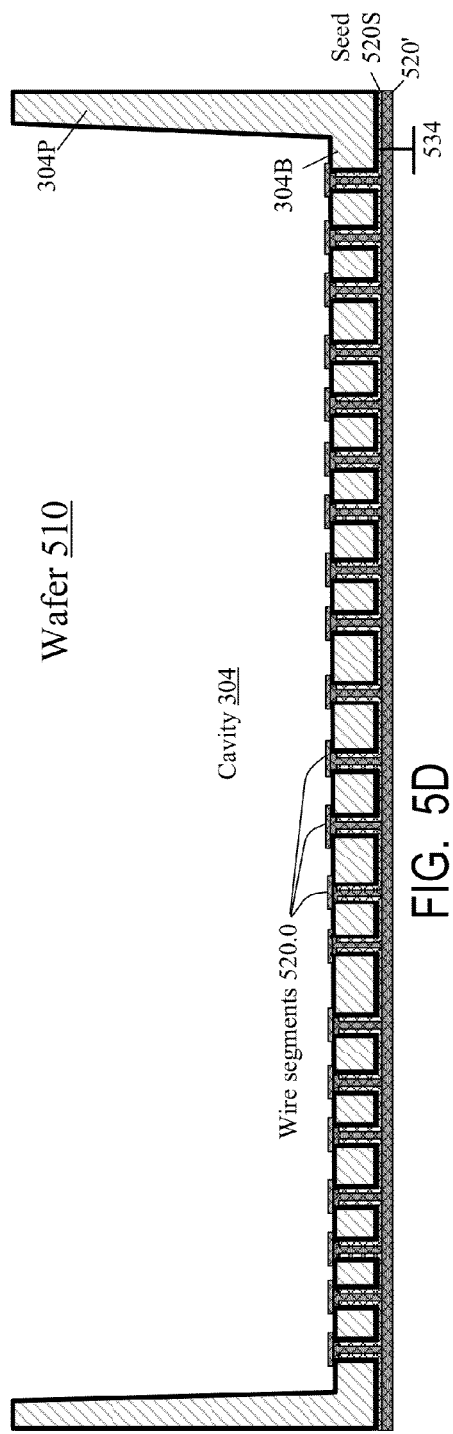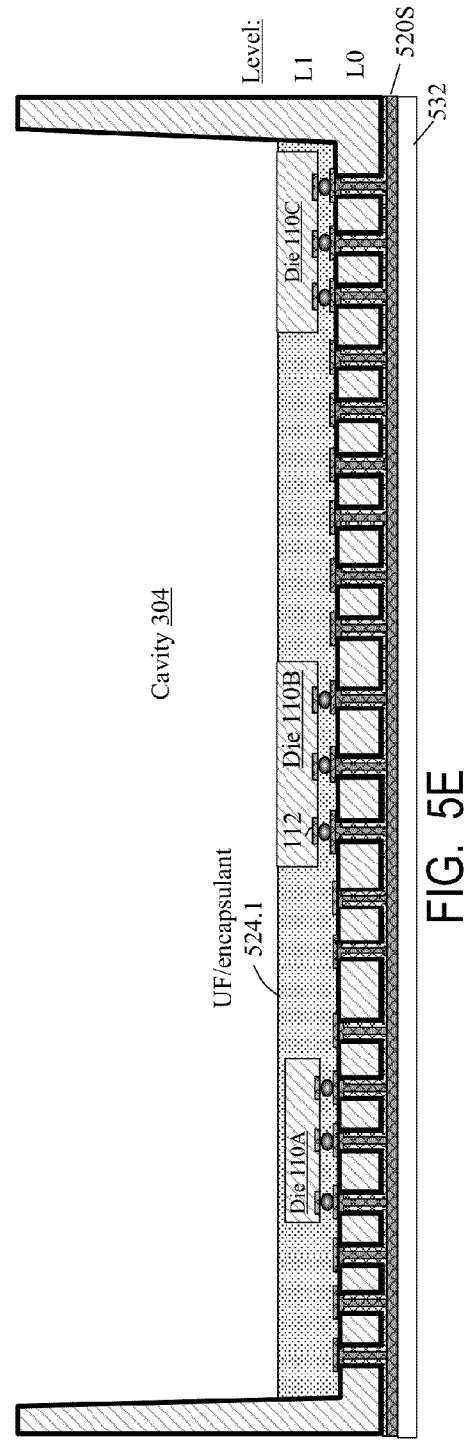
FIG. 5D
FIG. 5E

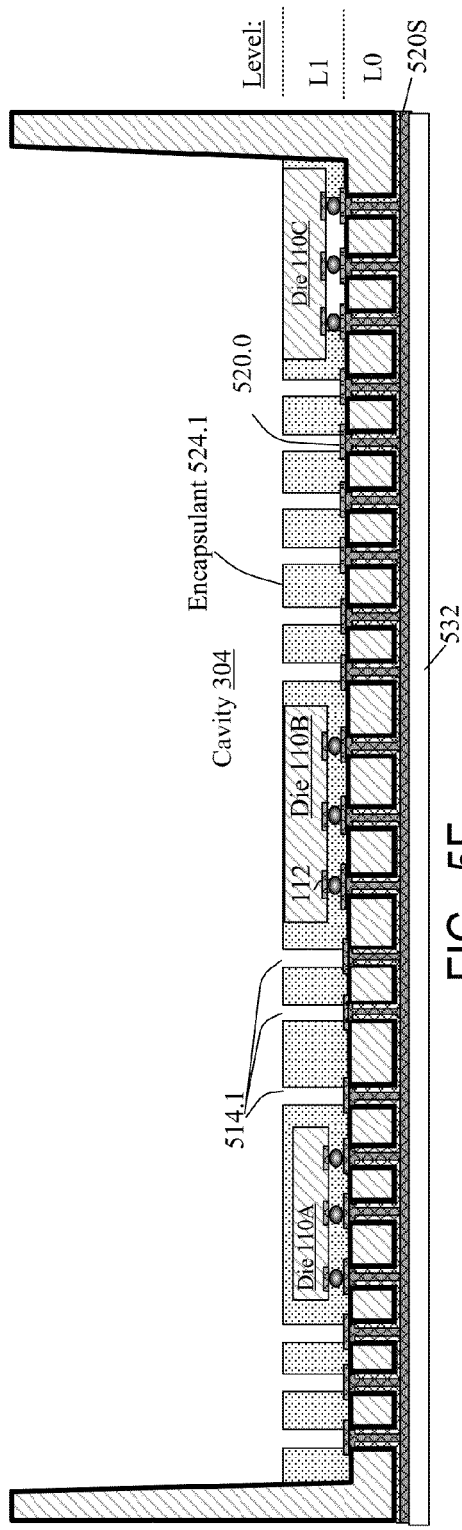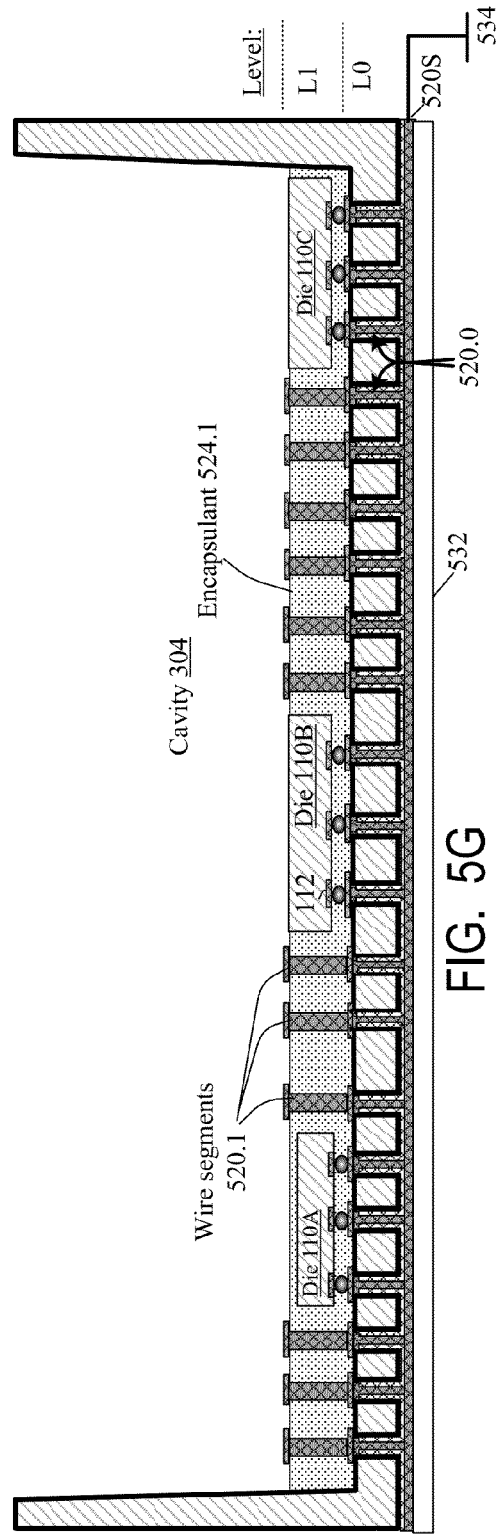

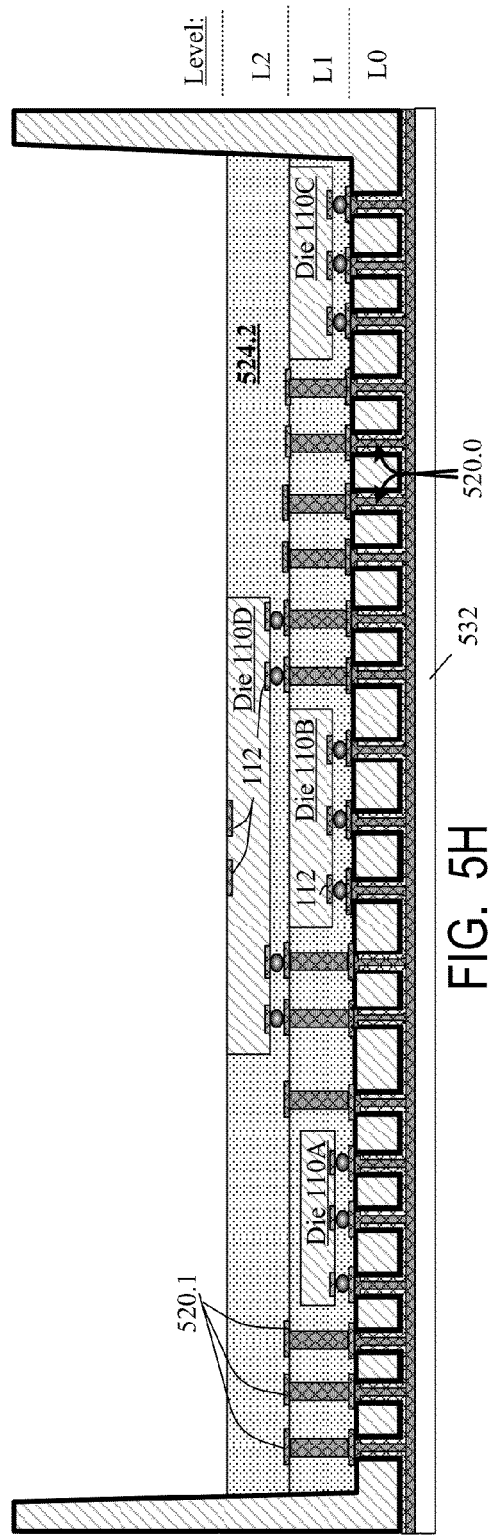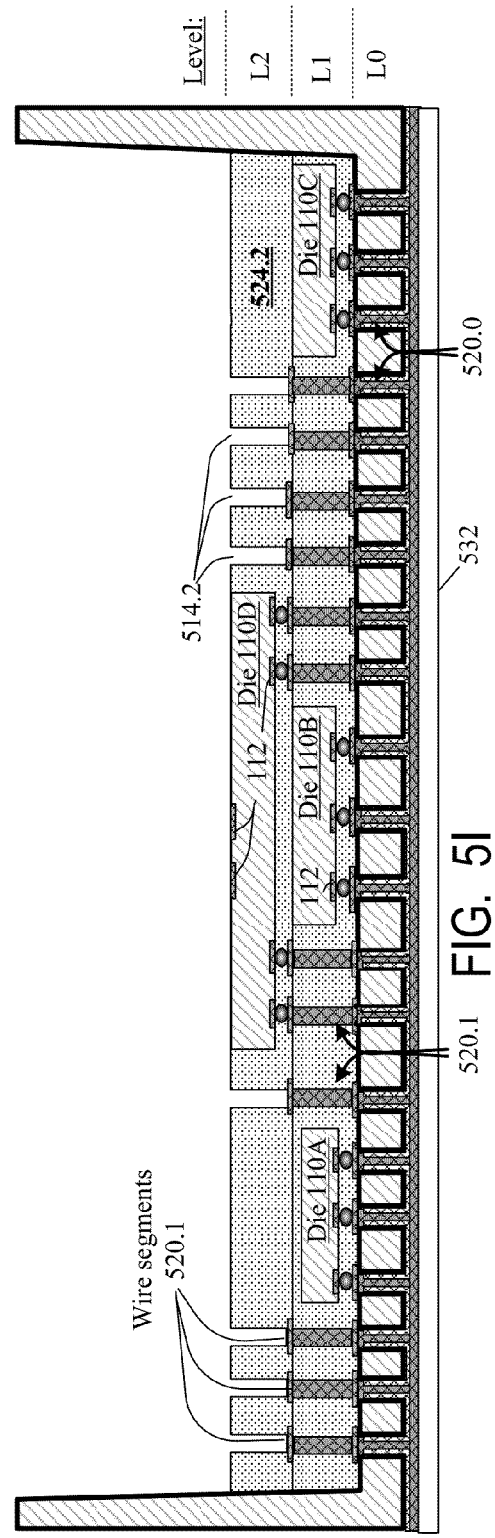

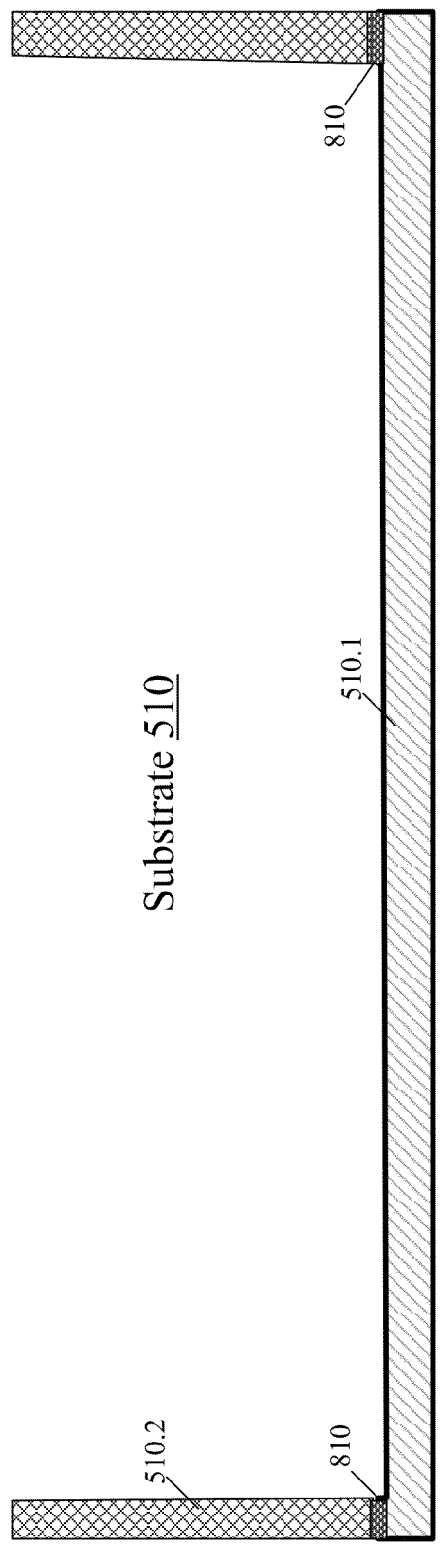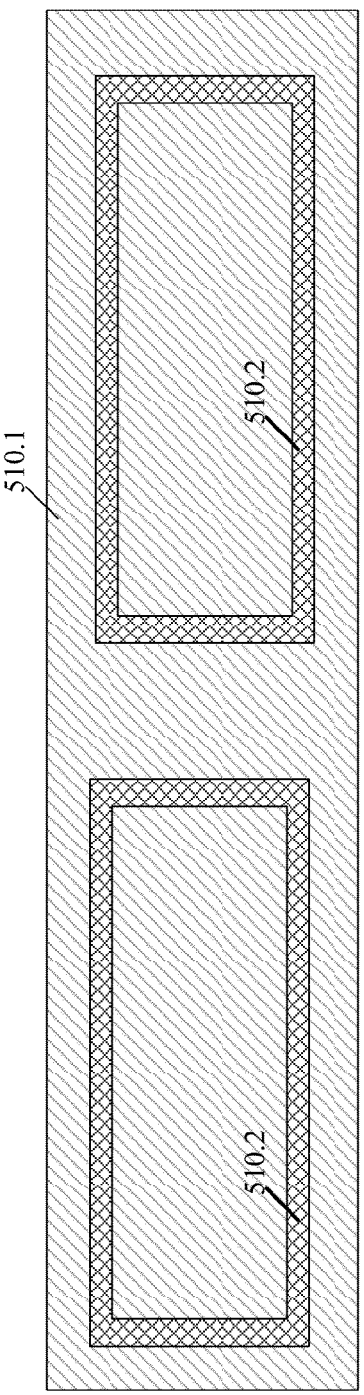
FIG. 8A
FIG. 8B

US 9,324,626 B2

INTERPOSERS WITH CIRCUIT MODULES ENCAPSULATED BY MOLDABLE MATERIAL IN A CAVITY, AND METHODS OF FABRICATION

CROSS REFERENCE TO RELATED APPLICATIONS

The present application claims priority of a U.S. provisional patent application No. 61/952,066, filed Mar. 12, 2014, incorporated herein by reference.

BACKGROUND OF THE INVENTION

The present invention relates to semiconductor technology, and more particularly to use of auxiliary substrates for interconnection of semiconductor integrated circuits and other components.

Semiconductor integrated circuits (ICs) are miniature devices with tiny contact pads that must be connected to other IC or non-IC components. The connection to other components is facilitated by auxiliary substrates such as printed circuit boards (PCBs) or interposers. FIG. 1 illustrates ICs 110 connected to a PCB 114 through an interposer 120. ICs 110 have contact pads 112 attached to contact pads 120C.T on top of interposer 120. The attachment is via connections 140 that can be solder, adhesive, or thermocompression for example. The interposer's bottom contact pads 120C.B are attached to the PCB's contact pads 114C (by suitable connections 140). Interconnect lines 120L in interposer 120 provide desired connection between the interposer's contact pads 120C (i.e. 120C.T and 120C.B). The PCB's interconnect lines 114L provide desired connection between the PCB's contact pads 114C. Other interposers, ICs, or other circuits can be connected to the PCB.

To provide small size, high operating speed, low power consumption, and low manufacturing cost, each component 110, 114, 120 may have densely packed circuitry with correspondingly densely packed contact pads 112, 114C, 120C and preferably short interconnect lines ("wires") 114L, 120L. In particular, the interposer 120 should be thin to shorten the vertical segments of lines 120L. Thin interposers can be inexpensively fabricated from organic or ceramic materials. However, a thin interposer can be fragile and flexible and can be easily warped or broken by mechanical stresses, such as thermal stresses arising from thermal expansion. Thermal stresses are particularly damaging in the presence of materials with different coefficients of thermal expansion (CTEs). For example, silicon has a lower CTE than organic or ceramic materials commonly used in PCBs and interposers, and this is a serious problem for using organic or ceramic PCBs and interposers with silicon-based ICs. Thermal stresses can damage the connections 140 and make the assembly inoperable. Also, thermal stresses contribute to warpage which complicates the assembly process.

Therefore, it is desired to stiffen the interposer against warpage and also to use thermally conductive materials that spread locally generated heat and conduct such heat into the ambient.

FIG. 2 illustrates a known ceramic or organic interposer 120 with a cover 210 over a die 110 (a die is an IC that was manufactured as part of a semiconductor wafer and then separated from the wafer; the wafer may contain multiple dies fabricated at the same time). The interposer connects the die 110 to bottom contact pads 120C.B; lines 120L are not shown. Cover 210 is attached to interposer 120 by epoxy 220. Cover 210 stiffens and flattens the interposer, and acts like a heat spreader: the heat generated by die 110 is conducted through thermal grease 230 to cover 210 and then to the ambient. See U.S. Pat. No. 7,061,102 issued Jun. 13, 2006 to Eghan et al.

In order to reduce thermal stresses at the interface between stiffener 210 and interposer 120, the stiffener and the interposer can be made in a single substrate 120S as shown in FIG. 3 and described in the Eghan patent. Substrate 120S has a cavity 304 containing the die 110; the die is surrounded by the substrate's "perimeter wall" 304P. The assembly can be further strengthened by underfill 310 between the die and the interposer: the underfill is made of epoxy that glues the die to the interposer and thus relieves the stress on connections 140. Also, the underfill can be thermally conductive to spread the heat. In addition, thermally conductive encapsulant 320 fills the spaces between the die and the walls 304P to protect the die and help in heat spreading. The encapsulant may or may not cover the die, and an additional heat spreader (not shown) may be provided on top.

FIG. 4 illustrates an organic (molded epoxy or plastic) interposer 120 supporting a stack of three dies 110.1, 110.2, 110.3, as described in U.S. Pat. No. 6,492,726 (Quek et al., Dec. 10, 2002). Here the interposer cavity 304 has stepped sidewalls, with different dies 110.1, 110.2, 110.3 mounted on respective different steps 410.1, 410.2, 410.3 (410.1 is the cavity bottom). For each step, contact structures 420 extend from the respective "contact balls" 140 down through the interposer where they can be accessed from below the interposer. See also U.S. Pat. No. 7,977,579 (Bathan et al., Jul. 12, 2011).

The dies 110 (i.e. 110.1, 110.2, 110.3) of FIG. 4 can be underfilled and encapsulated with suitable dielectric materials (not shown). A heat spreader (not shown) can be provided on top.

SUMMARY

This section summarizes some features of the invention. Other features may be described in the subsequent sections. The invention is defined by the appended claims, which are incorporated into this section by reference.

Some embodiments provide architectures and fabrication techniques suitable for organic, ceramic, silicon, or other types of interposers with cavities. An interposer structure may include multiple levels of dies or multi-chip modules (MCMs). Some embodiments provide simple manufacturing processes.

The invention is not limited to the features and advantages described above except as defined by the appended claims.

BRIEF DESCRIPTION OF THE DRAWINGS

FIGS. 5A, 5B.1 show vertical cross sections of interposers in the process of fabrication according to some embodiments of the present invention.

FIG. 5B.2 is a top view of an interposer in the process of fabrication according to some embodiments of the present invention.

FIGS. 5C, 5D, 5E, 5F, 5G, 5H, 5I, 5J, 5K, 5L, 6, 7, 8A show vertical cross sections of interposers in the process of fabrication according to some embodiments of the present invention.

FIG. 8B is a top view of an interposer in the process of fabrication according to some embodiments of the present invention.

DESCRIPTION OF SOME EMBODIMENTS

The embodiments described in this section illustrate but do not limit the invention. The invention is defined by the appended claims.

Figure 1:
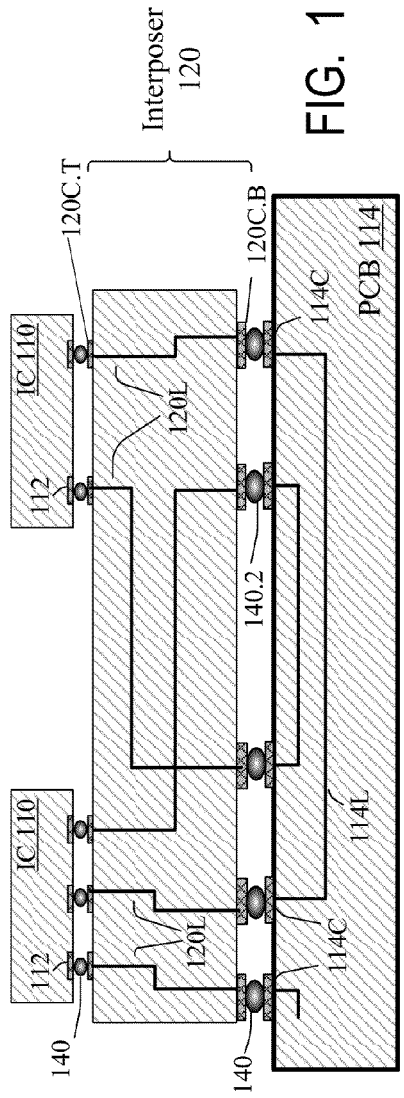
FIGS. 1, 2, 3, 4 show vertical cross sections of structures with interposers according to prior art.
Figure 3:
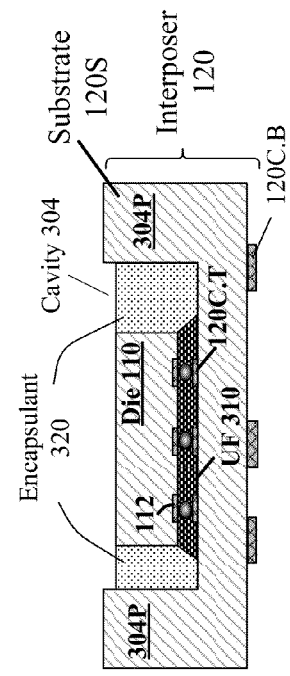
Figure 2:
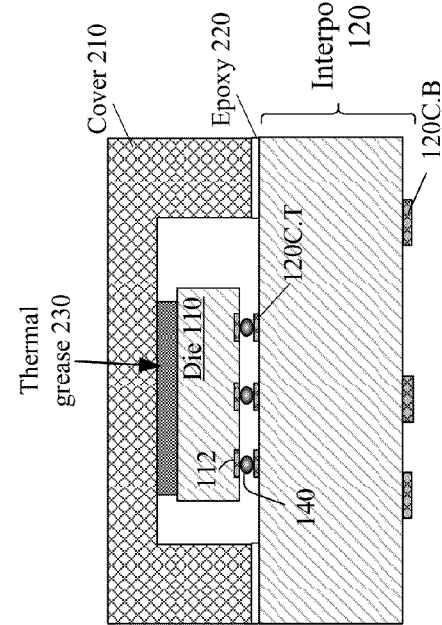
Figure 4:
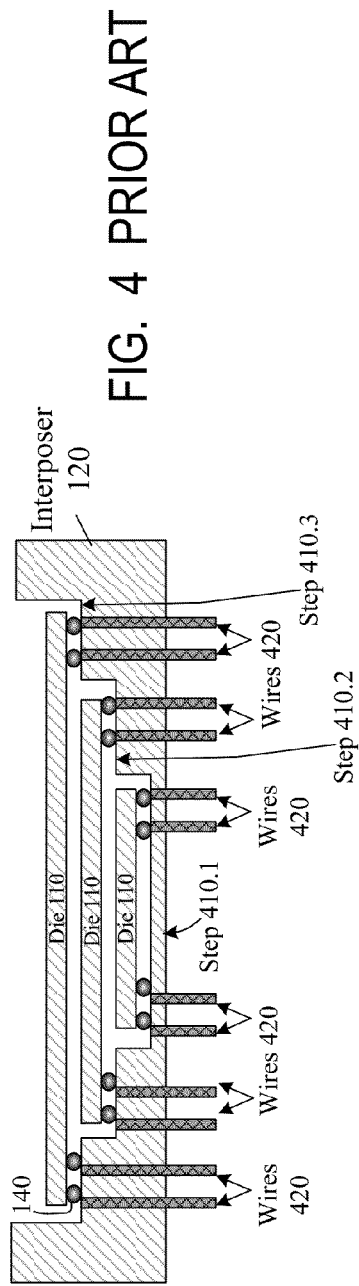

In some embodiments of the present invention, stacked dies or multi-chip modules (MCM) can be placed in an interposer cavity that may have any shape, as in FIGS. 2-4 or other shapes. Some embodiments use vertical wires similar to 420 for connecting upper dies to circuitry below the interposer. However, in some embodiments, the wires go only through a small portion of the interposer thickness. For example, the wires may go through the cavity's bottom wall but not through any portion of the peripheral walls.

In some embodiments, the assembly is manufactured as a stack of levels inside the cavity; each level includes a respective die or dies 110 and encapsulant encircling the dies. A vertical wire may go through multiple encapsulant levels. A wire's segment through each level is made separately by depositing conductive material in a hole made in this level. This short segment is easier to fabricate than depositing conductive material into a deeper hole whose depth is the entire length of the wire. Since the long wires are easier to fabricate, higher stacking is possible, and each wire can be narrower to improve the wire density.

Figure 5A:
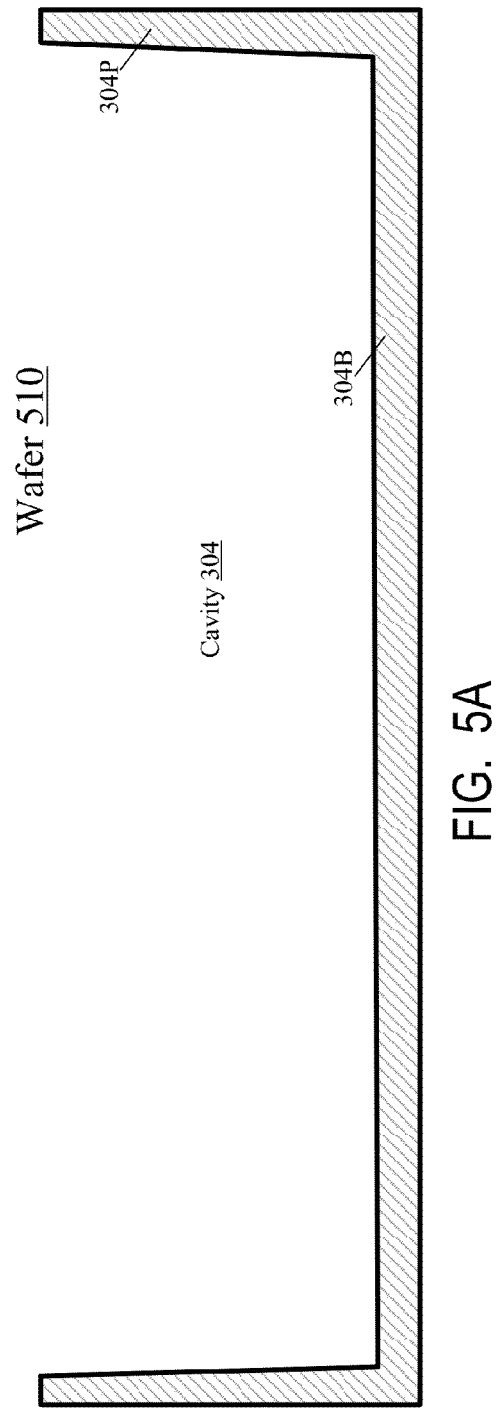

FIG. 5A illustrates the beginning stages of interposer fabrication according to some embodiments of the present invention. As shown in FIG. 5A, the interposer fabrication starts with a substrate 510, e.g. a wafer made of silicon (monocrystalline or some other type) or another semiconductor or non-semiconductor material. We will focus on fabrication techniques suitable for wafers made of silicon, but similar techniques can be used for other semiconductor and non-semiconductor materials including metals, glass, ceramic, polymers, organic or composite materials, and including laminates.

Wafer 510 is sufficiently thick to provide desired stiffness, heat dissipation, and/or other desired properties. For example, some embodiments use a monocrystalline silicon wafer of 200 or 300 mm diameter and at least 650 micron thickness. In some embodiments, the length of vertical wires to be made in the structure need not be taken into account in selecting the wafer thickness because the wire length is not defined by the wafer thickness.

Cavity 304 is formed in the top surface of wafer 510, by a masked etch for example. Multiple etches can be used, with different masks, to provide a stepped sidewall as in FIG. 4 if desired. An exemplary cavity depth is 400 microns or less. The vertical wires will pass through the cavity's bottom wall 304B.

We will refer to the top side of wafer 510 as the "cavity side", and the bottom side as the "anti-cavity side". Also, we will refer to the cavity side as the "top side", and will always show it on top, even though the wafer can be turned upside down or at any angle during fabrication or operation. Likewise, we will call the anti-cavity side the "bottom side".

If multiple interposers are fabricated in the same wafer, then multiple cavities 304 can be formed at the same time. The multiple interposers can be made simultaneously, and the wafer can later be diced to separate the interposers. Only one interposer will be shown for simplicity.

The lateral extent of the cavity is defined by perimeter walls 304P. The walls are sufficiently wide (horizontally) to provide desired stiffness and keep flat the cavity's bottom wall 304B and the entire wafer 510.

Then (FIG. 5B.1) holes 514.0 are made through the cavity's bottom wall 304B to accommodate the bottom segments of the vertical wires. FIG. 5B.2 is the top view of the structure, with an array of holes 514.0. The holes may be in any number, and may have any geometry (circular as in FIG. 5B.2, square, or some other shape).

The holes can be made by a masked etch. The mask can be made on the anti-cavity side, and the etch can be conducted from the anti-cavity side. Alternatively, masking and etching can be done from the cavity side. Non-masking techniques can also be used, e.g. laser ablation or stamping from the cavity or anti-cavity side (stamping is appropriate if the interposer is made of a soft material, such as soft plastic). Other methods can also be used. For moldable materials (e.g. plastics), the structure of FIGS. 5B.1 and 5B.2 can be made by molding without any etches or masks.

Holes 514.0 will contain conductive through-substrate vias (TSVs) for the vertical wires. Conventional formation of high density TSVs is a challenging process because on the one hand, the TSVs should be narrow for high density, and on the other hand the substrate has to be thick to provide mechanical strength. Making narrow TSVs through a thick substrate is difficult. However, the wafer of FIGS. 5B.1, 5B.2 is strengthened by peripheral walls 304P, and the TSVs pass only through the bottom wall 304B. If the bottom wall 304B is thin, the TSVs can be narrow and therefore can be at higher density. The bottom wall's thickness is 20 microns or less in some silicon embodiments.

If desired, circuitry (not shown) is formed in wafer 510, possibly including transistors, diodes, capacitors, and/or other circuit elements. The circuitry can be formed in the walls 304P and/or 304B before formation of cavities 304 and/or at any other fabrication stages.

We will refer to holes 514.0 as "level-zero holes" or "level L0 holes". Other holes will be made at higher levels as described below. (We use the concept of levels for ease of description; the invention pertains to structures and methods and not to any description techniques.)

Figure 5C:
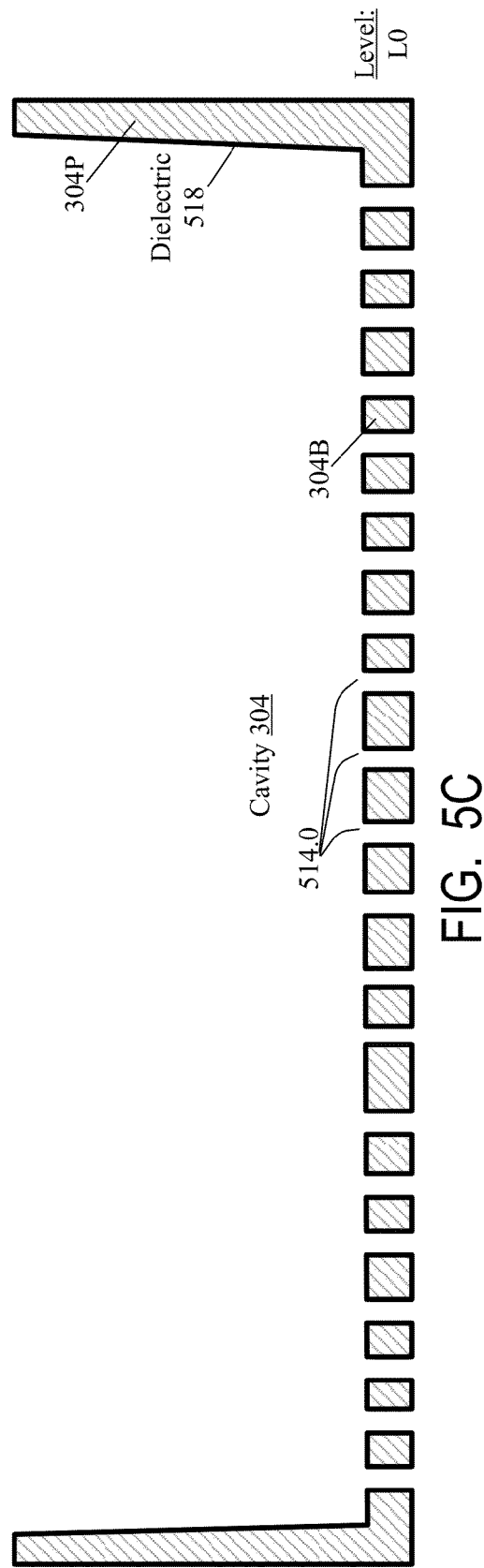

If wafer 510 is made of a non-dielectric material (e.g. silicon), dielectric 518 (FIG. 5C) can be formed on the holes' sidewalls. The dielectric may cover all the wafer as in FIG. 5C, or may cover just the holes' surfaces and possibly additional areas as needed. If the dielectric covers the whole wafer, no masking is needed. If the dielectric covers only the hole surfaces, the dielectric can be formed using the same mask (not shown) that was used to form the holes 514.0 (the dielectric can be patterned by a lift-off process for example).

The dielectric can be formed by sputtering (this is appropriate for silicon dioxide, silicon nitride, and some other dielectric materials), or thermal oxidation (if the wafer is made of silicon or some other oxidizable material whose oxide is dielectric), or by some other process. The above processes and dielectric materials are not limiting.

If desired, a barrier layer (not shown) can be formed over the dielectric 518 in the holes and elsewhere, to protect the wafer from contamination by subsequently formed materials, e.g. metals.

As shown in FIG. 5D, holes 514.0 are filled (or lined) with conductive material 520.0 to form TSVs that will serve as wire segments. This can be done by sputtering or other techniques, e.g. electroplating (which is relatively inexpensive). In the example of FIG. 5D, the electroplating uses a seed layer 520S formed to cover the anti-cavity side. The seed layer may or may not enter the holes 514.0. In an exemplary embodiment, the seed layer is copper formed by sputtering. To prevent copper formation on the top (cavity) side, the sputtering can be performed at an angle, i.e. the wafer can be inclined to prevent the copper molecules from reaching the cavity through the holes. Alternatively, the seed layer can be foil (e.g. copper foil) laminated on the anti-cavity side. Other techniques can also be used.

Then the structure is placed in a plating bath (not shown), and the seed layer 520S is connected to a terminal 534 of an electric power source to serve as a cathode in the plating operation. As a result, the holes 514.0 are plated with conductor 520.0, e.g. copper. Conductor 520.0 fills the holes 514.0, and thus provides contact pads at the cavity bottom, i.e. at the top surface of bottom wall 304B. The contact pads may be wider than the holes 514.0.

Conductor 520.0 may include multiple layers made in different electroplating and/or electroless-plating steps.

As shown in FIG. 5D, if seed 5105 is not masked from the bottom, the conductor can also be plated on the bottom of the seed layer. The conductor plated on the seed layer's bottom is marked as 520' in FIG. 5D, but is not marked separately in subsequent drawings. Rather, to simplify the drawings, we use numeral 520S both for the seed layer and the conductor 520', and we refer to both layers as "seed layer 520S".

Conductor 520.0, 520S may include multiple conductive layers. In some embodiments, the conductor top surfaces (inside the cavities) are usable as seed for electroplating of other wire segments as described below.

An optional protective layer 532 (FIG. 5E), e.g. polyimide or some other organic polymer, can be deposited on the bottom surface of layer 520' to protect the structure and avoid electroplating on the bottom surface in subsequent plating steps.

One or more dies 110 are placed into the cavity onto bottom wall 304B. Three dies 110A, 110B, 110C are shown, and any number can be present. The dies' contact pads 112 are attached to respective contact pads 520.0 (by connections such as 140 described above, e.g. solder, adhesive, thermocompression, or possibly other types (possibly discrete wires); different connections can be used for different dies in the same structure). We will refer to these dies as level-one dies or level L1 dies or L1 dies.

The dies are underfilled and encapsulated by a suitable dielectric encapsulant 524.1 (level-one or L1 "encapsulant" below). Underfilling can be done by capillary or no-flow techniques. Encapsulation can be done by spin-on deposition and curing of moldable material or possibly by other techniques. Suitable underfill and encapsulant materials can be conventional, including organic polymer resins—such as BCB (benzocyclobutene) or epoxy—with suitable fillers, or possibly other types. We will refer to the underfill and encapsulant as "encapsulant 524.1".

In FIG. 5E, encapsulant 524.1 reaches as high as the top surfaces of dies 510B and 510C, thus encapsulating these dies laterally and below, but the encapsulant does not cover these dies. The encapsulant covers the die 110A. The encapsulant can reach any level, and in particular can cover more than one dies, and/or on the contrary can terminate below the top surfaces of one or more of the dies. The top surface level can be adjusted by lowering the encapsulant level after deposition, e.g. using chemical etching or etching by abrasives (e.g. dry or wet blasting).

Some of contact pads 520.0 are not covered by any L1 die 110.

Holes 514.1 (FIG. 5F) are formed in the encapsulant to expose contact pads 520.0 not covered by L1 dies 110. We will refer to holes 514.1 as level-1 or L1 holes. A suitable process for making L1 holes 514.1 depends on the encapsulant's material. For example, for resins, laser ablation can be used, which is a known technique in fabrication of through-mold vias (TMVs). If the encapsulant is photoimageable, then photolithographic techniques can be used, i.e. exposure to light through a glass-based mask followed by development in a developer solution. These examples are not limiting.

L1 holes 514.1 expose contact pads 520.0. The holes are filled or lined with conductor 520.1 (FIG. 5G) to form level-L1 wire segments. Segments 520.1 can be formed by electroplating: the plating current can be provided from the anti-cavity side through seed layer 520S and L0 wire segments 520.0, by connecting the seed layer to an electric power source's terminal 534. Conductor 520.1 fills (or lines) L1 holes 514.1, and thus provides contact pads ("L1 contact pads") at the top surface of L1 encapsulant 524.1. The L1 contact pads may be wider than the L1 holes 514.1.

This process can be continued any number of times, to build any number of levels. For example, FIGS. 5H-5L illustrate level L2 formation. One or more dies 110 ("L2 dies"), including the die 110D, are attached on top of level L1; the dies' contact pads are attached to L1 contact pads 520.1. In this embodiment, die 110D has contact pads 112 both on top and bottom. The top contact pads 112 will be attached to overlying circuitry (not yet formed).

L2 encapsulant 524.2 is formed to underfill and encapsulate the L2 dies. L2 holes 514.2 (FIG. 5I) are formed in L2 encapsulant 524.2 to expose those L1 contact pads 520.1 that are not covered by a die. L2 holes 514.2 are filled or lined with conductor 520.2 (FIG. 5I) which provides L2 wire segments. Conductor 520.2 can be formed by electroplating; the plating current can be provided from the bottom side through seed layer 520S and lower-level wire segments 520.0, 520.1 by connecting the seed layer 520S to a terminal 534 of an electric power source. The L2 wire segments 520.2 contact the underlying L1 wire segments 520.1 and provide contact pads at the top of L2 encapsulant 524.2. The contact pads can be wider than the L2 holes 514.2. The L2 features can be formed using the same processes as described above for level L1.

Figures 5J, 5K:
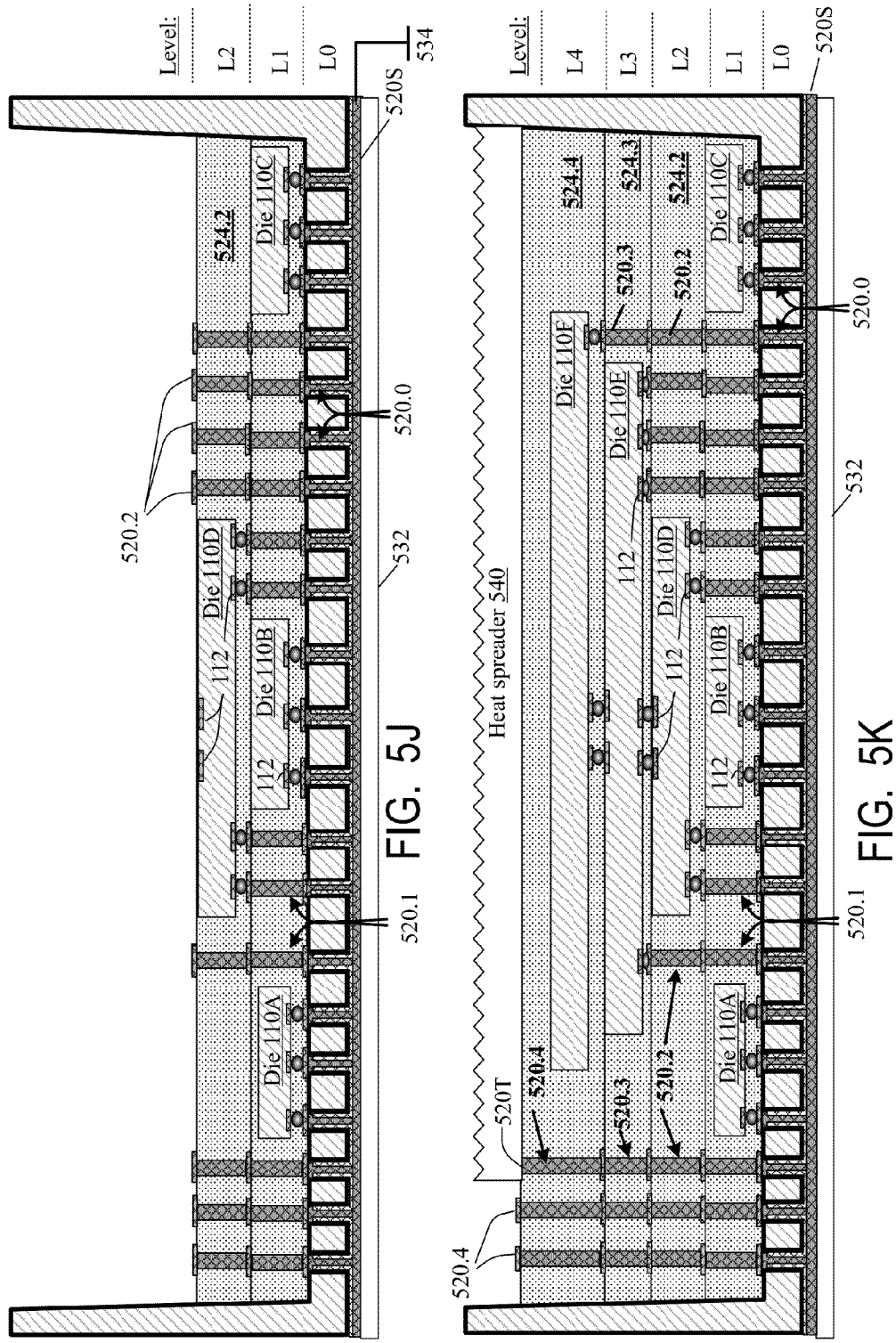

FIG. 5K shows a final structure with four levels and a heat spreader 540 on top. Level L3 includes a die 110E some of whose bottom contact pads are attached to the level L2 contact pads 520.2 (not marked in this figure). Other bottom contact pads of die 110E are attached to top contact pads 112 of L2 die 110D. L3 die 110E is underfilled and laterally encapsulated by encapsulant 524.3 made of moldable material. L3 wire segments 520.3 are vertical segments passing through encapsulant 524.3. L4 die 110F has bottom contact pads attached to top contact pads of L3 die 110E and to the wire segments 520.3 (to the top contact pads provided by these segments). L3 wire segments 520.3 can be formed by electroplating; the plating current can be provided from the bottom side through lower-level wire segments 520.0, 520.1, 520.2. L4 die 110F is underfilled and laterally encapsulated by encapsulant 524.4 made of moldable material. L4 wire segments 520.4 are vertical segments passing through encapsulant 524.4. External circuits (not shown), e.g. dies, MCMs, or discrete wires or other discrete components, can be attached to the top ends of segments 520.4. The top ends can be formed to facilitate such attachment; for example, if the attachment will be by solder, then a barrier layer such as nickel can be electroplated or electroless-plated to protect underlying portions of segments 520.4 from solder contamination; and gold can be electroplated or electroless-plated on top of segments 520.4 to block oxidation during soldering.

The structure of FIG. 5K includes a vertical wire 520T having no electrical functionality but provided for heat removal. This wire consists of vertical segments 520 of levels 0 through 4 (i.e. 520.0, 520.1, 520.2, 520.3, 520.4). This wire reaches heat spreader 540. The top level segments 520.4 can be formed by electroplating; the plating current can be provided from the bottom side through lower-level wire segments 520.0, 520.1, 520.2, 520.3. Any number of heat-removal wires can be provided; the heat-removal wires may or may not reach the heat spreader.

The top level L4 includes wire segments 520.4 that provide contact pads at the top of encapsulant 520.4 side-by-side with heat spreader 540. These contact pads can be connected to external circuits as mentioned above.

In some embodiments, each encapsulant layer 524 is deposited and cured in a separate operation; the encapsulant layer does not have any separately-cured sub-layers. Therefore, the encapsulant layer does not have any internal surface boundaries that would be present between sub-layers. An internal surface boundary is characterized by surface states. A surface state is a state with molecules having higher energies than below the surface; surface states may be detectable visually (possibly using microscopy) or perhaps by ultrasound or other ways. The invention is not limited to such embodiments however.

In some embodiments, if a die or dies 110 of a level Li are underfilled in a separate operation than lateral encapsulation, and the underfill is separately cured, then the encapsulant layer may have a surface at the boundary between the underfill and laterally encapsulating portion of the encapsulant. Further, the laterally encapsulating portion can be made of a different material than the underfill.

Figure 5L:
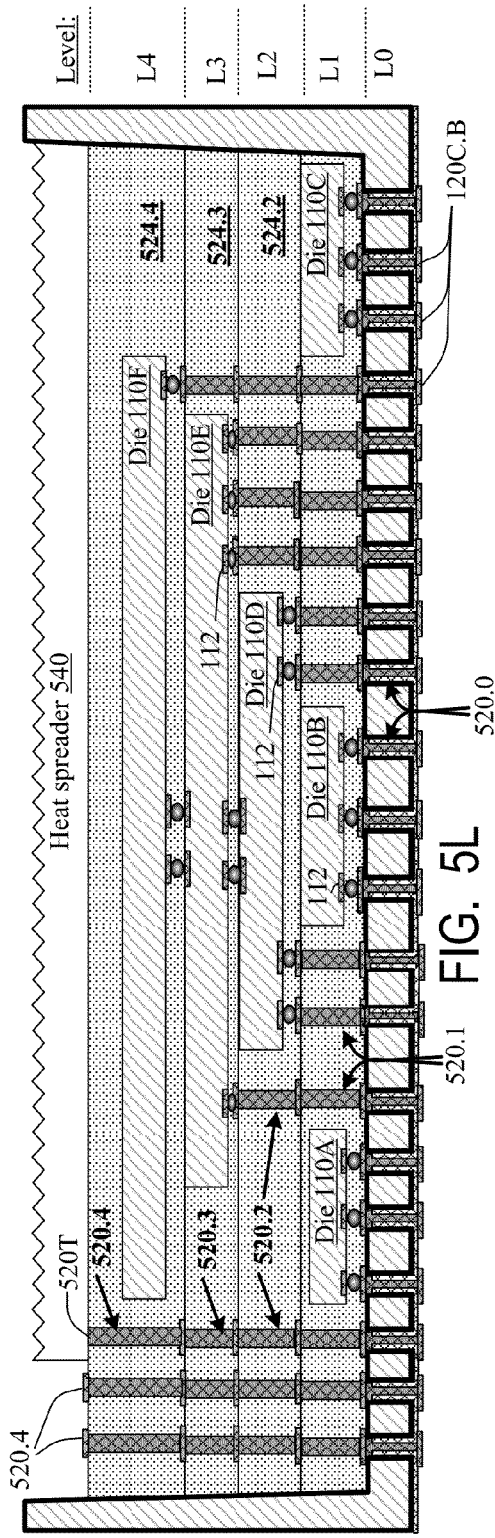

After or at any point during fabrication of all the levels, the interposer's bottom can be processed to remove or pattern protective layer 532 and conductor 520S in any desired manner. In FIG. 5L, layer 532 is removed, and the conductor is thinned and patterned to provide contact pads 120C.B at the ends of wire segments 520.0. These contact pads can be attached to other dies, MCMs, or packaging substrates such as PCBs or interposers. Alternatively, other circuitry can be formed on the bottom, e.g. as part of a redistribution layer (RDL) including multiple dielectric, conductive, and semiconductor layers that provide circuitry coupled to wire segments 520.0 and accessible from below the interposer. The redistribution layer may have contact pads at the bottom that can be coupled to other dies, MCMs, or packaging substrates such as PCBs or interposers.

Figure 6:
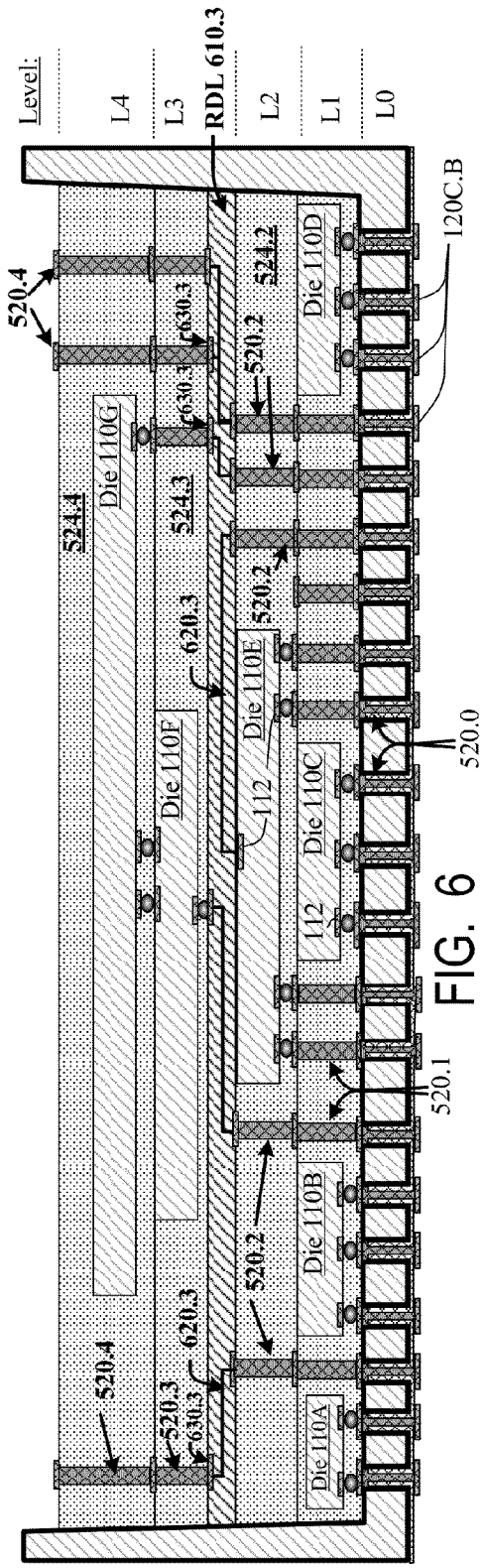

FIG. 6 shows additional features that may be available in some embodiments. Here level L3 includes a redistribution layer 610.3 which may have a number of conductive layers separated by dielectric layers. The conductive layers provide interconnects 620.3 which extend both vertically and laterally (possibly horizontally). Interconnects 620.3 terminate in contact pads 630.3 at the top of the RDL. Interconnects 620.3 interconnect the underlying wire segments 520.2 and the overlying wire segments 520.3 as desired. In some embodiments, the dielectric layers of RDL 610.3 are formed of the same or similar materials as encapsulant layers 524 (e.g. moldable organic polymer deposited by a spin-on process, or from other materials described above), and are patterned by the same techniques (e.g. photolithography or laser ablation). The conductive layers can also be formed by other deposition and patterning techniques, e.g. using photolithography or by additive manufacturing (printing).

In the example of FIG. 6, some RDL lines 620.3 connect L2 wire segments 520.2 to L3 wire segments 520.3. A line 620.3 connects a top contact pad 112 of L2 die 110E to the top of an L2 wire segment 520.2. Another line 620.3 connects an L2 wire segment 520.2 to a bottom contact pad of L3 die 110F.

Contact pads 630.3 at the ends of lines 620.3 can provide an area array pattern or other patterns as needed for connection to L3 dies and wire segments.

Figure 7:
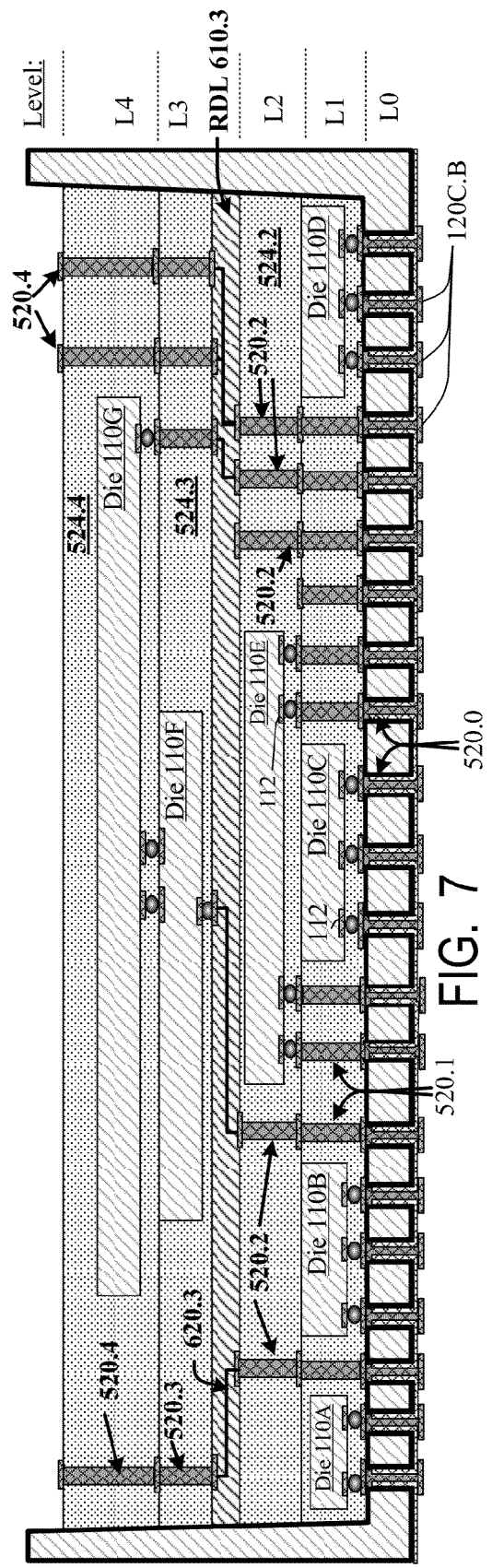

In some embodiments, level L2 includes a die that has no bottom contact pads, but has only top contact pads connected to other circuitry by RDL 610.3. Any level may include a die having no bottom contact pads and having top contact pads attached to other circuits within or outside the cavity. Also a die may have no top contact pads. In the example of FIG. 7, die 110E has no top contact pads, and further L2 encapsulant 524.2 covers the die, and RDL 610.3 covers the encapsulant.

Level L3 wire segments 520.3 (FIGS. 6, 7) can be formed at the top of RDL 610.3 by electroplating; the plating current is conducted from the bottom layer 520S to the top of RDL 610.3 through wire segments 620.3.

L4 wire segments 520.4 and their respective underlying L3 segments 520.3 are for heat removal.

Above, RDL 610.3 is associated with level L3, but this is simply a matter of terminology: we could say that RDL 610.3 is part of level L2. An RDL can be provided at any level. Also, multiple alternating RDLs and encapsulant layers can be provided in a single level, i.e. for a single set of dies 110 attached to the preceding level.

Substrate 510 can be assembled from different substrates, and an example is shown in FIGS. 8A (vertical cross section) and 8B (top view on a smaller scale than FIG. 8A). In this example, substrate 510 includes a planar substrates 510.1 and a substrate 510.2 attached to planar substrate 510.1. The attachment is by adhesive 810, but direct bonding can also be used. In FIG. 8B, multiple substrates 510.2 (called "frames" below) are attached to a single planar substrate 510.1, and multiple structures are formed of the type of FIG. 7 or other types discussed above on the same planar substrate 510.1. The planar substrate 510.1 can be diced along lines (not shown) passing between the frames 510.2 at the end of fabrication or at any other fabrication stage.

Planar substrate 510.1 and frames 510.2 can be made of the same or different materials, including any materials mentioned above for wafer 510. Adhesive 810, if present, can be any suitable adhesive, e.g. plastic deposited in a flowable form and then cured using heat, pressure, radiation, and/or other means. Non-flowable adhesives can also be used. Substrate 510 may include a stack of more than two substrates, e.g. each frame 510.2 or planar substrate 510.1 may be a laminate of multiple substrates.

Regardless of whether or not the substrate 510 is an assembly of multiple substrates, substrate 510 (and each constituent substrate if present) may be a uniform or non-uniform medium, i.e. may or may not have the same physical properties at each internal point. In some embodiments, substrate 510 is uniform with respect to any one or more of the following properties: chemical composition, density, elasticity modulus, conductivity, dielectric constant, ultrasound (US) propagation speed for one or more wavelengths (possibly all US wavelengths), light propagation speed for one or more wavelengths (e.g. wavelengths in the infrared range and below). For example, uniform substrate 510 can be a single crystal (e.g. monocrystalline silicon), and can be organic or inorganic, and can be a composite material or other materials described above. These examples are not limiting. If the substrate 510 is an assembly of multiple pieces such as 510.1 and 510.2, then in some embodiments an interface region of the adjacent pieces (the region including adjacent parts of the two pieces) is not uniform with respect to at least one of the properties mentioned above, i.e. chemical composition, density, elasticity modulus, conductivity, dielectric constant, ultrasound propagation speed for one or more wavelengths, light propagation speed for one or more wavelengths. For example, in FIG. 7A, the interface region can be defined as including adhesive 810 and adjacent surfaces of substrates 510.1 and 510.2, and the interface is not uniform if the adhesive has a different chemical composition than the adjacent surfaces of substrate 510.1 or 510.2. If the attachment is by direct bonding of substrate 510.1 to 510.2 and the substrates are made of the same material (e.g. silicon), the interface can be uniform, and the substrate 510 can be indistinguishable from a substrate made initially from a single piece. However, the interface can also be non-uniform with respect to light or sound propagation speed, e.g. if the interface includes bubbles or other states detectable by US or spectral imaging.

The invention is not limited to the embodiments described above. Other embodiments and variations are within the scope of the invention, as defined by the appended claims.

The invention claimed is:

1. A circuit assembly comprising a plurality of levels "Li" where Li varies from L0 through Ln, i being an integer varying from 0 to n, wherein n is an integer greater than one, the circuit assembly comprising a substrate whose top side comprises a cavity comprising a bottom wall;
wherein the level L0 comprises:
the bottom wall;
a plurality of through-holes each of which passes through the bottom wall;
a plurality of conductors ("L0 conductors") in respective through-holes;
wherein at least part of level L1 overlies at least part of level L0, and wherein level L1 comprises one or more circuit modules each of which has one or more contact pads each of which is electrically connected to one or more L0 conductors;
wherein for each level Li other than L0 and L1:
at least part of level Li overlies at least part of level Li-1;
each level Li comprises one or more circuit modules each of which has one or more contact pads each of which is electrically connected to one or more L0 conductors by one or more first electrically conductive paths lying in the cavity, each first electrically conductive path passing through each level L1 through Li-1;
wherein at least one first electrically conductive path passes through more than one of the levels L1 through Ln-1.

2. A circuit assembly comprising a plurality of levels "Li" where Li varies from L0 through Ln, i being an integer varying from 0 to n, wherein n is an integer greater than one, the circuit assembly comprising a substrate whose top side comprises a cavity comprising a bottom wall;
wherein the level L0 comprises:
the bottom wall;
a plurality of through-holes each of which passes through the bottom wall;
a plurality of conductors ("L0 conductors") in respective through-holes;
wherein for each level Li other than L0 and L1:
at least part of level Li overlies at least part of level Li-1;
each level Li comprises one or more circuit modules each of which has one or more contact pads each of which is electrically connected to one or more L0 conductors by one or more first electrically conductive paths lying in the cavity;
wherein the substrate comprises:
a first substrate comprising the bottom wall; and
a second substrate comprising sidewalls of the cavity, the second substrate being attached to the first substrate;
wherein an interface region of the first and second substrates is not uniform with respect to at least one of: chemical composition, density, elasticity modulus, conductivity, dielectric constant, ultrasound propagation speed for one or more wavelengths, light propagation speed for one or more wavelengths not exceeding an infrared wavelength.

3. The circuit assembly of claim 1 further comprising a plurality of first encapsulant layers made of a moldable material, wherein each level L1 through Ln-1 comprises at least one first encapsulant layer laterally encapsulating the one or more circuit modules at that level.

4. The circuit assembly of claim 3 wherein at least a first portion of each first encapsulant layer rises at least as high as a top surface of at least one circuit module laterally encapsulated by the first encapsulant layer;
wherein at least the first portion of each first encapsulant layer reaches down at least as low as a bottom surface of at least one circuit module laterally encapsulated by the first encapsulant layer;
wherein at least the first portion of each first encapsulant layer is formed in a single curing operation with no separately cured sub-layers.

5. The circuit assembly of claim 4 wherein for each first electrically conductive path passing through any first encapsulant layer, the first electrically conductive path comprises a vertical segment passing through the first encapsulant layer.

6. The circuit assembly of claim 3 wherein at least one level Li with i greater than 0 comprises at least one horizontal segment in at least one first electrically conductive path passing through the level's first encapsulant layer, the horizontal segment being below the first encapsulant layer of the level Li.

7. The circuit assembly of claim 6 wherein the horizontal segment overlies the first encapsulant layer of the level Li-1 and at least one die of the level Li-1, the die being covered by the first encapsulant layer of the level Li-1.

8. A circuit assembly comprising a plurality of levels "Li" where Li varies from L0 through Ln, i being an integer varying from 0 to n, wherein n is an integer greater than one, the circuit assembly comprising a substrate whose top side comprises a cavity comprising a bottom wall;
wherein the level L0 comprises:
the bottom wall;
a plurality of through-holes each of which passes through the bottom wall;
a plurality of conductors ("L0 conductors") in respective through-holes;
wherein for each level Li other than L0 and L1:
at least part of level Li overlies at least part of level Li-1;
each level Li comprises one or more circuit modules each of which has one or more contact pads each of which is electrically connected to one or more L0 conductors by one or more first electrically conductive paths lying in the cavity;
wherein the assembly further comprises:
a plurality of first encapsulant layers made of a moldable material, wherein each level L1 through Ln-1 comprises at least one first encapsulant layer laterally encapsulating the one or more circuit modules at that level; and
one or more second electrically conductive paths in the cavity, wherein each second electrically conductive path does not have electrical functionality but is for enhancing heat removal from the circuit assembly to the ambient, wherein each second electrically conductive path extends from an L0 conductor through one or more levels other than L0.

9. The circuit assembly of claim 3 wherein each first encapsulant layer has a planar top surface.

10. The circuit assembly of claim 1 wherein each through-hole through the bottom wall is vertical, and each L0 conductor is vertical.

11. A manufacturing method comprising:
obtaining a structure comprising:
a substrate whose top side comprises a cavity comprising a bottom wall, the substrate comprising a plurality of through-holes ("L0 through-holes") each of which passes through the bottom wall;
a plurality of conductors ("L0 conductors") each of which passes through a respective L0 through-hole;
a conductive layer underlying the bottom wall and electrically connected to each L0 conductor;
attaching one or more circuit modules ("L1 circuit modules") to a bottom of the cavity to electrically connect one or more contact pads of each L1 circuit module to one or more L0 conductors;
forming an encapsulant layer ("L1 encapsulant layer") of a moldable material to laterally encapsulate the one or more L1 circuit modules;
forming one or more through-holes ("L1 through-holes") in the L1 encapsulant layer, each L1 through-hole exposing a feature provided by, or electrically connected to, at least one L0 conductor; and
electroplating conductive material into the L1 through-holes onto the features exposed by the L1 through-holes, to form one or more L1 conductors, each L1 conductor passing through a respective L1 through-hole, wherein the electroplating comprises providing an electroplating current flowing through the features, the L0 conductors, the conductive layer, and a terminal of an electric power source coupled to the conductive layer.

12. The method of claim 11 wherein the substrate comprises:
a first substrate comprising the bottom wall; and
a second substrate comprising sidewalls of the cavity, the second substrate being attached to the first substrate; and
obtaining the structure comprises attaching the first substrate to the second substrate to provide said substrate.

13. The method of claim 11 further comprising forming a redistribution layer on the bottom of the cavity, wherein said features are at a top of the redistribution layer, the redistribution layer electrically connecting the features to the L0 conductors.

14. The method of claim 11 further comprising:
attaching one or more circuit modules ("L2 circuit modules") inside the cavity to electrically connect one or more contact pads of each L2 circuit module to one or more L1 conductors;
forming an encapsulant layer ("L2 encapsulant layer") of a moldable material to laterally encapsulate the one or more L2 circuit modules;
forming one or more through-holes ("L2 through-holes") in the L2 encapsulant layer, each L2 through-hole exposing a feature provided by, or electrically connected to, at least one L1 conductor; and
electroplating conductive material into the L2 through-holes onto the features exposed by the L2 through-holes, to form a plurality of L2 conductors, each L2 conductor passing through a respective L2 through-hole, wherein the electroplating comprises providing an electroplating current flowing through the L1 conductors, the L0 conductors, the conductive layer, and a terminal of an electric power source coupled to the conductive layer.

15. A circuit assembly comprising:
a substrate whose top side comprises a cavity comprising a bottom wall;
a plurality of through-holes each of which passes through the bottom wall;
a plurality of conductors in respective through-holes;
a plurality of circuit modules in the cavity, each circuit module having one or more contact pads;
a plurality of first encapsulant layers overlying one another in the cavity, wherein each first encapsulant layer is made of a moldable material and laterally encapsulates one or more of the circuit modules;
a plurality of first electrically conductive paths each of which lies in the cavity and passes through one or more first encapsulant layers to connect at least one contact pad of at least one circuit module to at least one of said conductors, at least one of the first electrically conductive paths passing through more than one of the first encapsulant layers.

16. A circuit assembly comprising:
a substrate whose top side comprises a cavity comprising a bottom wall;
a plurality of through-holes each of which passes through the bottom wall;
a plurality of conductors in respective through-holes;
a plurality of circuit modules in the cavity, each circuit module having one or more contact pads;
a plurality of first encapsulant layers overlying one another in the cavity, wherein each first encapsulant layer is made of a moldable material and laterally encapsulates one or more of the circuit modules;
a plurality of first electrically conductive paths each of which lies in the cavity and passes through one or more first encapsulant layers to connect at least one contact pad of at least one circuit module to at least one of said conductors;
wherein the substrate comprises:
a first substrate comprising the bottom wall; and
a second substrate comprising sidewalls of the cavity, the second substrate being attached to the first substrate;
wherein an interface region of the first and second substrates is not uniform with respect to at least one of: chemical composition, density, elasticity modulus, conductivity, dielectric constant, ultrasound propagation speed for one or more wavelengths, light propagation speed for one or more wavelengths not exceeding an infrared wavelength.

17. The circuit assembly of claim 15 wherein at least a first portion of each first encapsulant layer rises at least as high as a top surface of at least one circuit module laterally encapsulated by the first encapsulant layer;
wherein at least the first portion of each first encapsulant layer reaches down at least as low as a bottom surface of at least one circuit module laterally encapsulated by the first encapsulant layer;
wherein at least the first portion of each first encapsulant layer is formed in a single curing operation with no separately cured sub-layers.

18. The circuit assembly of claim 17 wherein each encapsulant layer has a planar top surface.

19. The circuit assembly of claim 15 further comprising one or more horizontal electrically conductive interconnects each of which belongs to at least one first electrically conductive path passing through a first encapsulant layer overlying the horizontal electrically conductive interconnect.

20. A circuit assembly comprising:
a substrate whose top side comprises a cavity comprising a bottom wall;
a plurality of through-holes each of which passes through the bottom wall;

a plurality of conductors in respective through-holes;

a plurality of circuit modules in the cavity, each circuit module having one or more contact pads;

a plurality of first encapsulant layers overlying one another in the cavity, wherein each first encapsulant layer is made of a moldable material and laterally encapsulates one or more of the circuit modules;

a plurality of first electrically conductive paths each of which lies in the cavity and passes through one or more first encapsulant layers to connect at least one contact pad of at least one circuit module to at least one of said conductors;

one or more second electrically conductive paths in the cavity, wherein each second electrically conductive path does not have electrical functionality but is for enhancing heat removal from the circuit assembly to the ambient, wherein each second electrically conductive path begins at a conductor in the through-hole and extends through one or more of the encapsulant layers.

21. The circuit assembly of claim 15 wherein each through-hole through the bottom wall is vertical, and each conductor in each through-hole in the bottom wall is vertical.

22. The circuit assembly of claim 1 wherein each said circuit module is a die or a multi-chip module.

23. The circuit assembly of claim 1 wherein at least one first electrically conductive path passing through more than one of the levels L1 through Ln comprises a vertical segment terminating at a contact pad attached to a contact pad of at least one said circuit module at a level other than L1.

24. The circuit assembly of claim 1 wherein at least one first electrically conductive path passing through more than one of the levels L1 through Ln comprises a vertical segment terminating at a contact pad attached to a contact pad of at least one said circuit module at a level other than L1 and other than L2.

25. The circuit assembly of claim 1 wherein the substrate is uniform medium with respect to chemical composition, density, elasticity modulus, dielectric constant, ultrasound (US) propagation speed for one or more US wavelengths, and infrared radiation propagation speed for one or more infrared wavelengths.

26. The method of claim 11 wherein each said circuit module is a die or a multi-chip module.

27. The circuit assembly of claim 15 wherein each said circuit module is a die or a multi-chip module.

28. The circuit assembly of claim 15 wherein at least one first electrically conductive path passing through more than one of the first encapsulant layers comprises a vertical segment terminating at a contact pad attached to a contact pad of at least one said circuit module laterally encapsulated by one of said first encapsulant layers overlying at least one other one of said first encapsulant layers.

29. The circuit assembly of claim 15 wherein at least one first electrically conductive path passing through more than one of the first encapsulant layers comprises a vertical segment terminating at a contact pad attached to a contact pad of at least one said circuit module laterally encapsulated by one of said first encapsulant layers overlying at least two other ones of the said first encapsulant layers.

30. The circuit assembly of claim 15 wherein the substrate is uniform medium with respect to chemical composition, density, elasticity modulus, dielectric constant, ultrasound (US) propagation speed for one or more US wavelengths, and infrared radiation propagation speed for one or more infrared wavelengths.

* * * * *